(12) United States Patent
Shen et al.

(10) Patent No.: US 10,863,650 B2
(45) Date of Patent: Dec. 8, 2020

(54) AIR-VAPOR SEPARATION METHOD FOR IMMERSED LIQUID COOLING SYSTEM AND DEVICE THEREOF

(71) Applicant: Dawning Information Industry (Beijing) Co., Ltd, Beijing (CN)

(72) Inventors: Weidong Shen, Beijing (CN); Chen Wang, Beijing (CN); Hongjie Wu, Beijing (CN); Xing Li, Beijing (CN); Jingnan Peng, Beijing (CN); Zhen Sun, Beijing (CN); Xintao Cui, Beijing (CN); Jin Chen, Beijing (CN)

(73) Assignee: Dawning Information Industry (Beijing) Co., Ltd, Beijing (CN)

(*) Notice: Subject to any disclaimer, the term of this patent is extended or adjusted under 35 U.S.C. 154(b) by 0 days.

(21) Appl. No.: 16/608,904

(22) PCT Filed: Apr. 28, 2017

(86) PCT No.: PCT/CN2017/082334
§ 371 (c)(1),
(2) Date: Oct. 28, 2019

(87) PCT Pub. No.: WO2018/195885
PCT Pub. Date: Nov. 1, 2018

(65) Prior Publication Data
US 2020/0084918 A1     Mar. 12, 2020

(51) Int. Cl.
*H05K 7/20*    (2006.01)
*F25B 1/00*    (2006.01)
(Continued)

(52) U.S. Cl.
CPC ......... *H05K 7/20354* (2013.01); *F25B 1/005* (2013.01); *F25B 43/043* (2013.01);
(Continued)

(58) Field of Classification Search
CPC . H05K 7/203; H05K 7/20818; H05K 7/20827
See application file for complete search history.

(56) References Cited

U.S. PATENT DOCUMENTS

| 2008/0302505 A1* | 12/2008 | Kato | F25B 25/005 165/61 |
| 2015/0184949 A1* | 7/2015 | So | F28D 15/0266 361/700 |
| 2019/0159360 A1* | 5/2019 | Uchida | F28D 15/0266 |

FOREIGN PATENT DOCUMENTS

| CN | 1791774 A | 6/2006 |
| CN | 106569565 A | 4/2017 |

OTHER PUBLICATIONS

International Search Report of PCT Patent Application No. PCT/CN2017/082334 dated Jan. 31, 2018.

* cited by examiner

*Primary Examiner* — Mukundbhai G Patel

(57) ABSTRACT

The present invention relates to an air-vapor separation method for separating air from refrigerant vapor in an immersed liquid-cooling system. The immersed liquid-cooling system comprises an immersed server blade cabinet, a condensing device, an air-vapor separator and a refrigerant storage tank, wherein the refrigerant storage tank supplies a liquid refrigerant to the immersed server blade cabinet, and the liquid refrigerant undergoes a phase change to be vaporized into a refrigerant vapor for cooling of the heating element in the immersed server blade cabinet; the condensing device condenses the refrigerant vapor; the air-vapor separator separates a mixed gas in the immersed liquid-cooling system into the air and the refrigerant vapor. The cooling efficiency of the liquid-cooling system is improved by effectively separating the air from the refrigerant vapor in the liquid-cooling system.

19 Claims, 1 Drawing Sheet

(51) Int. Cl.
    *F25B 43/04* (2006.01)
    *F25B 45/00* (2006.01)
    *F28D 20/02* (2006.01)

(52) U.S. Cl.
    CPC ............ *F25B 45/00* (2013.01); *F28D 20/021* (2013.01); *H05K 7/203* (2013.01); *H05K 7/20318* (2013.01); *H05K 7/20327* (2013.01); *H05K 7/20827* (2013.01)

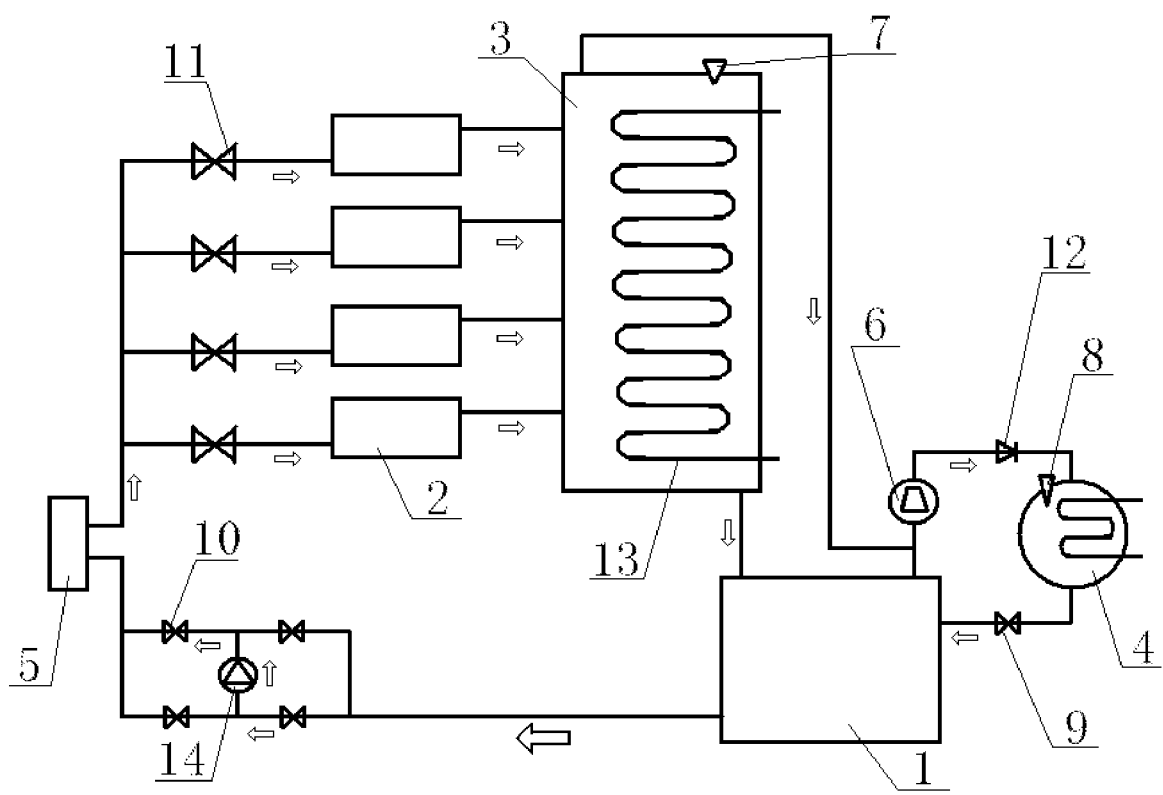

AIR-VAPOR SEPARATION METHOD FOR IMMERSED LIQUID COOLING SYSTEM AND DEVICE THEREOF

FIELD OF THE APPLICATION

The present invention relates to the technical field of computer, in particular, to an air-vapor separation method for a cooling system of an immersed liquid-cooling server and a device thereof.

BACKGROUND OF THE APPLICATION

Most of the computers currently used rely on cold air to cool the machine, but in the data center, the air-cooling alone is not enough to meet the heat dissipation requirements for servers with high heat flux density. The traditional air-cooling mode is carried out by indirect contact cooling. It has the disadvantages of complicated heat transmission, contact thermal resistance and convection heat transfer resistance, large sum of thermal resistance, low heat transfer efficiency, large temperature difference between heat sources with high and low temperature during heat transfer, and being carried out by requiring outdoor heat sources with lower temperature to guide the heat transfer.

The liquid-cooling method uses the working fluid as a medium for intermediate heat transfer, transferring heat from the hot zone to a remote location for subsequent cooling. Since the specific heat of the liquid is much larger than that of the air, the heat dissipation speed is much larger than that of the air, so the cooling efficiency is much higher than that of the air-cooling. The water-cooling or liquid-cooling has two advantages of directly guiding coolant to the heat source instead of indirect cooling like air-cooling, and the heat transferred per unit volume, i.e., heat dissipation efficiency, being as high as 3500 times as compared with the air-cooling.

Two features of the liquid-cooling heat dissipation system are to balance CPU heat and to operate in low noise. Since the specific heat capacity of the liquid is too large, a large amount of heat can be absorbed while keeping the temperature from changing significantly and the temperature of the CPU in the liquid-cooling system can be well controlled, so that the sudden operation will not cause a sudden and significant change in the internal temperature of the CPU. Since the heat exchanger has a large surface area, it is good to use only a low-speed fan to dissipate heat. Therefore, the liquid-cooling is mostly matched with a fan with a lower rotation speed. In addition, the working noise of the pump is generally not obvious, so the overall heat dissipation system is very quiet as compared with the air-cooling system.

In terms of thermal principle, evaporative cooling is using vaporization latent heat when the refrigerant boils to take way the heat. Since the vaporization latent heat of the liquid is much larger than the specific heat, the cooling effect of evaporative cooling is more remarkable in the liquid-cooling technique.

In an immersed liquid-cooling system where phase change occurs, since the original air in the system pipeline cannot be completely discharged, and the liquid-cooling system will be brought with a part of the air during daily maintenance and replacement of spare parts, this part of the air will mix with the refrigerant vapor. And then, since the air cannot be condensed, the cooling efficiency of the liquid-cooling system will be affected. Therefore, in immersed liquid-cooling system, the air must be separated from the refrigerant vapor to remove the air from the liquid-cooling system.

SUMMARY OF THE APPLICATION

For the drawbacks of the prior art, the present invention provides an air-vapor separation method for an immersed liquid-cooling system and a device thereof, which may effectively separate air from refrigerant vapor in the liquid-cooling system for improving the cooling efficiency of the liquid-cooling system.

In order to achieve the purpose of the present invention, the technical solution adopted by the present invention is to provide an air-vapor separation method for separating air from refrigerant vapor in an immersed liquid-cooling system, the immersed liquid-cooling system comprises an immersed server blade cabinet, a condensing device, an air-vapor separator and a refrigerant storage tank, wherein the air-vapor separator is connected to the condensing device and the refrigerant storage tank; the air-vapor separation method comprises steps of: the refrigerant storage tank supplying a liquid refrigerant to the immersed server blade cabinet, and the liquid refrigerant undergoing a phase change to be vaporized into a refrigerant vapor for cooling of the heating element in the immersed server blade cabinet; the condensing device condensing the refrigerant vapor, and the condensed liquid refrigerant being returned to the refrigerant storage tank; the air-vapor separator separating a mixed gas in the immersed liquid-cooling system, the mixed gas including the air and the refrigerant vapor.

According to some embodiments of the present invention, a mixed gas of the air and the refrigerant vapor collected in a top space of the condensing device and a top space of the refrigerant storage tank is pumped to the air-vapor separator for separation by a compressor.

According to some embodiments of the present invention, the air-vapor separator is provided with a low temperature condensing coil, and the refrigerant vapor in the mixed gas is condensed to a liquid to be returned to the refrigerant storage tank for continued use; the air in the mixed gas is discharged from the air-vapor separator.

In addition, the present invention also provides an air-vapor separation system for performing the air-vapor separation method as described above, comprising an immersed server blade cabinet, a condensing device, an air-vapor separator and a refrigerant storage tank, the air-vapor separator being connected to the condensing device and the refrigerant storage tank, wherein the immersed server blade cabinet is equipped with a heating element, the refrigerant storage tank supplies a liquid refrigerant to the immersed server blade cabinet, and the liquid refrigerant undergoes a phase change to be vaporized into a refrigerant vapor for cooling of the heating element; the condensing device condenses the refrigerant vapor; the air-vapor separator separates the air and the refrigerant mixed together in the immersed liquid-cooling system.

According to some embodiments of the present invention, a compressor pumping a mixed gas in the condensing device and the refrigerant storage tank to the air-vapor separator.

According to some embodiments of the present invention, the air-vapor separator is provided with a low temperature condensing coil, and the low temperature condensing coil condenses the refrigerant vapor in the mixed gas into a liquid to be separated from the air.

According to some embodiments of the present invention, a check valve disposed between the compressor and the air-vapor separator.

According to some embodiments of the present invention, the refrigerant storage tank and the immersed server blade cabinet are sequentially provided with a refrigerant delivery pump and a drying filter therebetween.

According to some embodiments of the present invention, the condensing device is provided with a low temperature condensing coil, and a cooling water flows in the low temperature condensing coil.

According to some embodiments of the present invention, the air-vapor separator is provided with a pressure relief valve thereon.

For the air-vapor separation method and system of the present invention, the air may be automatically separated from the refrigerant vapor without affecting the normal cooling of the liquid-cooling system, so that not only may the original air in the liquid-cooling system pipeline be discharged, but also may the air brought into the liquid-cooling system pipeline when repairing and replacing components be discharged for the recovery of the refrigerant, thereby greatly improving the cooling effect of the liquid-cooling system.

BRIEF DESCRIPTION OF THE ACCOMPANYING DRAWINGS

FIG. 1 illustrates a view showing an air-vapor separation system for immersed liquid-cooling refrigerant according to a first embodiment of the present invention.

Description of reference numerals: 1—refrigerant storage tank, 2—immersed blade cabinet, 3—condenser, 4—air-vapor separator, 5—drying filter, 6—compressor, 7—first pressure relief valve, 8—second pressure relief valve, 9—first on-off valve, 10—second on-off valve, 11—third on-off valve, 12—check valve, 13—condensing coil, 14—refrigerant delivery pump.

DETAILED DESCRIPTION OF THE PREFERRED EXAMPLES

To make the purpose, technical solutions and advantages of the present invention clearer, the embodiments of the present invention will be described below in detail in combination with the drawings. It should be noted that, in the case of no conflicts, the embodiments in the present invention and features in the embodiments can be combined mutually and arbitrarily.

According to an embodiment of the present invention, an immersed liquid-cooling system directly immerses a server board in a sealed cavity filled with refrigerant, and uses phase change heat transfer technology to solve the heat dissipation problem of the high-density server. Specifically, a blade server with a cabinet structure is adopted, and the blade server is a low-cost server platform for high availability and high density by inserting multiple card server units in a standard height rack cabinet (blade cabinet). The server board is installed in the blade cabinet, and all the boards are immersed in the refrigerant, and a certain space is left above the liquid surface as a gas phase zone.

As shown in FIG. 1, an immersed liquid-cooling system comprises a refrigerant storage tank 1, an immersed blade cabinet 2, a condenser 3, and an air-vapor separator 4. The refrigerant storage tank 1 and the immersed blade cabinet 2 are sequentially connected with a refrigerant delivery pump 14 and a drying filter 5; the immersed blade cabinet 2 is connected to the condenser 3; the condenser 3 and the refrigerant storage tank 1 are both in communication with the air-vapor separator 4 through a compressor 6.

The immersed blade cabinet 2 is inserted with a plurality of card type server board units that are all immersed in the refrigerant. The refrigerant is an evaporative cooling medium, preferably a fluorocarbon compound that meets environmental requirements. The medium has high insulation properties and does not cause short-circuit electrical accidents like water-cooling even if it leaks out, and has a boiling temperature that can be selected according to the optimal working temperature of the chip, the boiling point being generally selected to be 30-65 degrees. A certain space is left above the liquid level of the refrigerant in the immersed blade cabinet 2 as a gas phase zone. Since the immersed cooling is adopted, the heat radiated from the heating element of the server board unit during operation is transferred to the liquid refrigerant in the immersed blade cabinet 2, and the liquid refrigerant absorbs heat to heat up for absorbing a large amount of heat caused by boiling vaporization when the temperature reaches a corresponding saturation temperature so as to cool the heating element. The generated refrigerant vapor is diffused by the action of buoyancy to the gas phase zone above the liquid level of the refrigerant of the submerged blade cabinet 2, and the refrigerant vapor is drawn into the condenser 3 through the air outlet line.

The condenser 3 is a water-cooling condenser, that is, the secondary cooling medium is water. The condenser 3 includes a sealed housing, a condensing coil 13 in the housing, and a first pressure relief valve 7, a cooling water flowing in the condensing coil 13; the low temperature in the low temperature condensing coil 13 means that the temperature is much lower than the boiling point of the refrigerant liquid, rather than the low temperature means the usual sense. The housing is filled with refrigerant vapor delivered by the submerged blade cabinet 2 through the air outlet line. Since the original air in the system is usually not completely discharged, a top end of the condenser 3 has a mixed gas of air and refrigerant vapor. An opening is provided at the top end of the condenser 3, and the mixed gas of air and refrigerant vapor is sent into the air-vapor separator 4 via a transfer line through the opening.

The refrigerant storage tank 1 includes a first outlet, a second outlet, a first inlet, and a second inlet, and a refrigerant liquid in a liquid state is stored in the refrigerant storage tank 1. Similarly, since the original air in the system is usually not completely discharged, an upper space of the refrigerant storage tank 1 also has a mixed gas of air and refrigerant vapor. The refrigerant storage tank 1 delivers the liquid refrigerant to the submerged blade cabinet 2 via the first outlet through the refrigerant delivery pump 14. The first inlet and the second outlet are disposed at an upper portion of the refrigerant storage tank 1, wherein the first inlet receives the refrigerant liquid condensed by the condenser 3, and the second outlet sends the mixed gas of the upper space of the refrigerant storage tank 1 into the air-vapor separator 4. The refrigerant vapor separated by the air-vapor separator 4 is condensed and then sent back to the refrigerant storage tank 1 from the second inlet.

The air-vapor separator 4 includes a container, a detecting device, a low temperature condensing coil, a discharge valve, and a second pressure relief valve 8. Since the boiling point of the refrigerant vapor is low, the refrigerant vapor in the mixed gas is cooled by the low temperature condensing coil to become a liquid refrigerant again for thereby dripping and concentrating on the bottom of the air-vapor separator 4 so as to flow back to the storage tank 1 while the air remaining in the container, and finally, when the detecting devices detects that the concentration of the refrigerant vapor contained in the air is lower than a predetermined value, the air is discharged outside the container of the air-vapor separator 4.

As shown in FIG. 1, a refrigerant delivery pump 14 and a drying filter 5 are sequentially disposed in the liquid refrigerant delivery path of the refrigerant storage tank 1 to the submerged blade cabinet 2. A compressor 6 and a check valve 12 are sequentially disposed in the mixed gas delivery path of the refrigerant storage tank 1 to the air-vapor separator 4; a first on-off valve 9 is provided in the refrigerant return delivery path of the air-vapor separator 4 to the refrigerant storage tank 1. The sealed housing of the condenser 3 and the container of the air-vapor separator 4 are respectively provides with a first pressure relief valve 7 and a second pressure relief valve 8 for automatically relieving the pressure when the pressures in the housing of the condenser 3 and the container of the air-vapor separator 4 exceed a certain predetermined value to ensure safety.

The cooling cycle process of the submerged liquid-cooling system is as follows:

As shown in the FIG. 1, the liquid refrigerant stored in the refrigerant storage tank 1 is pressurized by the refrigerant delivery pump 14 and dried and filtered by drying filter 5 for sending the a vertical dispenser in the cabinet, then the vertical dispenser distributes the refrigerant evenly (in this embodiment, divided into four groups) to feed into the immersed blade cabinet 2 at different vertical heights in the cabinet through the liquid inlet pipe. For the blade server in the immersed blade cabinet 2 in running, the CPU and various electronic components generate a large amount of heat, causing the liquid refrigerant to boil and undergo a phase change, from a liquid state to a gaseous state. The refrigerant vapor will gradually collect in the gas phase zone of the upper portion of the housing of the submerged blade cabinet 2 for being taken out through the outlet pipe and sent to the condenser 3, and the refrigerant vapor surrounds the condensing coil 13 in the condenser 3; due to the presence of the cooling water in the condensing coil 13, the refrigerant vapor is condensed in the condenser 3 into a liquid refrigerant, and is returned to the refrigerant storage tank 1 through the pipeline, thereby completing the entire cooling cycle process.

The separation cycle process for the air-refrigerant vapor of the submerged liquid-cooling system is as follows:

As shown in the FIG. 1, the compressor 6 operates to introduce the mixed gas at the top space in the body of the immersed blade cabinet 2 and the mixed gas at the top space in the refrigerant storage tank 1 to the air-vapor separator 4 via the check valve 12, and then, the compressor 6 stops operating. The refrigerant vapor in the mixed gas is cooled by the low temperature condensing coil to become a liquid refrigerant again for thereby dripping and concentrating on the bottom of the air-vapor separator 4 so as to flow back to the storage tank 1 via the first on-off valve 9 while the air remaining in the container, and after a time period of T determined by the system, the refrigerant vapor is fully condensed and recovered, and the detecting device detects the content of the refrigerant vapor contained in the container of the air-vapor separator 4; then, when the concentration of the refrigerant vapor contained is lower than a predetermined value, indicating that the air-refrigerant vapor is fully separated, the discharge valve is opened to discharge the air to the outside of the container of the air-vapor separator 4, subsequently, the discharge valve is closed and the compressor 6 restarts operating to enter into the next separation cycle of air-refrigerant vapor.

For the air-vapor separation system and method of the present invention, not only may the original air in the liquid-cooling system pipeline be discharged, but also may the air brought into the liquid-cooling system pipeline when repairing and replacing components be discharged, thereby greatly improving the cooling effect of the liquid-cooling system.

While the embodiments of the present invention have been described above, the described embodiments are merely illustrative of the embodiments of the present invention, and are not intended to limit the present invention. Any modification and variation in the form and details of the embodiments may be made by those skilled in the art without departing from the spirit and scope of the invention, and maybe ought to fall within the scope of protection of the present application.

What is claimed is:

1. An air-vapor separation method for separating air from refrigerant vapor in an immersed liquid-cooling system, characterized in that,
    the immersed liquid-cooling system comprises an immersed server blade cabinet, a condensing device, an air-vapor separator and a refrigerant storage tank, wherein the air-vapor separator is connected to the condensing device and the refrigerant storage tank;
    the air-vapor separation method comprises steps of:
    the refrigerant storage tank supplying a liquid refrigerant to the immersed server blade cabinet, and the liquid refrigerant undergoing a phase change to be vaporized into a refrigerant vapor for cooling of a heating element in the immersed server blade cabinet;
    the condensing device condensing the refrigerant vapor, and the condensed liquid refrigerant being returned to the refrigerant storage tank;
    the air-vapor separator separating a mixed gas in the immersed liquid-cooling system, the mixed gas including the air and the refrigerant vapor;
    wherein the mixed gas of the air and the refrigerant vapor collected in a top space of the condensing device and a top space of the refrigerant storage tank is pumped to the air-vapor separator for separation by a compressor.

2. The air-vapor separation method for separating air from refrigerant vapor in an immersed liquid-cooling system according to claim 1, characterized in that,
    the air-vapor separator is provided with a low temperature condensing coil, and the refrigerant vapor in the mixed gas is condensed to a liquid to be returned to the refrigerant storage tank for continued use;
    the air in the mixed gas is discharged from the air-vapor separator.

3. An air-vapor separation system for performing the air-vapor separation method according to claim 1, characterized in that, comprising an immersed server blade cabinet, a condensing device, an air-vapor separator and a refrigerant storage tank, the air-vapor separator being connected to the condensing device and the refrigerant storage tank, wherein the immersed server blade cabinet is equipped with a heating element, the refrigerant storage tank supplies a liquid refrigerant to the immersed server blade cabinet, and the liquid refrigerant undergoes a phase change to be vaporized into a refrigerant vapor for cooling of the heating element; the condensing device condenses the refrigerant vapor; the air-vapor separator separates the air and the refrigerant mixed together in the immersed liquid-cooling system.

4. The air-vapor separation system according to claim 3, characterized in that, further comprising
a compressor pumping a mixed gas in the condensing device and the refrigerant storage tank to the air-vapor separator.

5. The air-vapor separation system according to claim 4, characterized in that, further comprising:
a check valve disposed between the compressor and the air-vapor separator.

6. The air-vapor separation system according to claim 5, characterized in that,
the condensing device is provided with a low temperature condensing coil, and a cooling water flows in the low temperature condensing coil.

7. The air-vapor separation system according to claim 4, characterized in that,
the air-vapor separator is provided with a low temperature condensing coil, and the low temperature condensing coil condenses the refrigerant vapor in the mixed gas into a liquid to be separated from the air.

8. The air-vapor separation system according to claim 7, characterized in that,
the refrigerant storage tank and the immersed server blade cabinet are sequentially provided with a refrigerant delivery pump and a drying filter therebetween.

9. The air-vapor separation system according to claim 7, characterized in that,
the condensing device is provided with a low temperature condensing coil, and a cooling water flows in the low temperature condensing coil.

10. The air-vapor separation system according to claim 4, characterized in that,
the refrigerant storage tank and the immersed server blade cabinet are sequentially provided with a refrigerant delivery pump and a drying filter therebetween.

11. The air-vapor separation system according to claim 4, characterized in that,
the condensing device is provided with a low temperature condensing coil, and a cooling water flows in the low temperature condensing coil.

12. The air-vapor separation system according to claim 3, characterized in that,
the air-vapor separator is provided with a low temperature condensing coil, and the low temperature condensing coil condenses the refrigerant vapor in the mixed gas into a liquid to be separated from the air.

13. The air-vapor separation system according to claim 12, characterized in that, further comprising:
a check valve disposed between the compressor and the air-vapor separator.

14. The air-vapor separation system according to claim 13, characterized in that,
the condensing device is provided with a low temperature condensing coil, and a cooling water flows in the low temperature condensing coil.

15. The air-vapor separation system according to claim 12, characterized in that,
the refrigerant storage tank and the immersed server blade cabinet are sequentially provided with a refrigerant delivery pump and a drying filter therebetween.

16. The air-vapor separation system according to claim 3, characterized in that,
the refrigerant storage tank and the immersed server blade cabinet are sequentially provided with a refrigerant delivery pump and a drying filter therebetween.

17. The air-vapor separation system according to claim 16, characterized in that,
the condensing device is provided with a low temperature condensing coil, and a cooling water flows in the low temperature condensing coil.

18. The air-vapor separation system according to claim 3, characterized in that,
the condensing device is provided with a low temperature condensing coil, and a cooling water flows in the low temperature condensing coil.

19. The air-vapor separation system according to claim 3, characterized in that,
the air-vapor separator is provided with a pressure relief valve thereon.

\* \* \* \* \*